United States Patent
Pfaffeneder et al.

(10) Patent No.: US 11,193,965 B2
(45) Date of Patent: Dec. 7, 2021

(54) SYSTEM FOR VECTOR NETWORK ANALYSIS OF A DEVICE UNDER TEST AS WELL AS METHOD FOR VECTOR NETWORK ANALYSIS OF A DEVICE UNDER TEST

(71) Applicant: Rohde & Schwarz GmbH & Co. KG, Munich (DE)

(72) Inventors: Korbinian Pfaffeneder, Munich (DE); Georg Schnattinger, Dorfen (DE); Marcel Thraenhardt, Freising (DE); Michael Katzer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 265 days.

(21) Appl. No.: 15/991,832

(22) Filed: May 29, 2018

(65) Prior Publication Data

US 2019/0369150 A1 Dec. 5, 2019

(51) Int. Cl.
| | | |
|---|---|---|
| *G01R 27/30* | (2006.01) | |
| *H04B 17/10* | (2015.01) | |
| *G01R 31/28* | (2006.01) | |
| *G01R 29/10* | (2006.01) | |
| *H04B 17/00* | (2015.01) | |

(52) U.S. Cl.
CPC ............ *G01R 27/30* (2013.01); *G01R 29/10* (2013.01); *G01R 31/2822* (2013.01); *H04B 17/0085* (2013.01); *H04B 17/101* (2015.01)

(58) Field of Classification Search
CPC combination set(s) only.
See application file for complete search history.

(56) References Cited

U.S. PATENT DOCUMENTS

| | | | |
|---|---|---|---|
| 7,398,056 B1* | 7/2008 | Ebert ................ | H04B 17/0085 455/42 |
| 8,841,923 B1* | 9/2014 | Vanwiggeren ..... | G01R 19/0053 324/606 |
| 9,720,023 B2* | 8/2017 | Ziomek ............... | H04B 17/16 |
| 9,733,289 B1* | 8/2017 | Bradley .............. | G01R 27/32 |
| 9,801,082 B2* | 10/2017 | Entsfellner .......... | G01R 35/005 |
| 9,860,054 B1* | 1/2018 | Bradley .............. | H04L 5/14 |
| 10,386,444 B1* | 8/2019 | Stickle ................ | H03L 7/00 |
| 2003/0153273 A1* | 8/2003 | Ebert .................. | H04L 1/0001 455/67.14 |
| 2004/0066182 A1* | 4/2004 | Evers .................. | G01R 23/14 324/76.23 |
| 2008/0018343 A1* | 1/2008 | Hayden ............... | G01D 18/00 324/601 |
| 2008/0094072 A1* | 4/2008 | Noujeim ............. | G01R 23/04 324/630 |

(Continued)

*Primary Examiner* — Zhitong Chen
(74) *Attorney, Agent, or Firm* — Christensen O'Connor Johnson Kindness PLLC (57) ABSTRACT

A system for vector network analysis of a device under test, comprising at least two measurement receivers, at least one signal generator device formed separately from the at least two measurement receivers, and at least one data processing unit connected with the measurement receivers. The connection between the data processing unit and at least one of the measurement receivers is flexible so that the position of the measurement receiver is adjustable. Further, a method for vector network analysis of a device under test is described.

19 Claims, 3 Drawing Sheets

(56) References Cited

U.S. PATENT DOCUMENTS

| | | | | |
|---|---|---|---|---|
| 2010/0102829 A1* | 4/2010 | Azarian | G01R 27/08 | 324/651 |
| 2010/0141305 A1* | 6/2010 | Ortler | G01R 27/28 | 327/117 |
| 2010/0238077 A1* | 9/2010 | Cho | H01Q 3/267 | 343/703 |
| 2012/0166129 A1* | 6/2012 | Kim | G01R 35/005 | 702/110 |
| 2012/0262188 A1* | 10/2012 | Nickel | H04B 17/20 | 324/629 |
| 2012/0293379 A1* | 11/2012 | Nickel | G01R 31/2822 | 343/703 |
| 2012/0319697 A1* | 12/2012 | Gregg | G01R 31/2822 | 324/511 |
| 2013/0015870 A1* | 1/2013 | Nickel | G01R 1/06772 | 324/754.03 |
| 2013/0197848 A1* | 8/2013 | Sariaslani | G01R 29/26 | 702/111 |
| 2014/0306719 A1* | 10/2014 | Dunsmore | G01R 35/005 | 324/601 |
| 2015/0133062 A1* | 5/2015 | Mrvaljevic | H04W 24/00 | 455/67.13 |
| 2015/0309101 A1* | 10/2015 | Ballo | G01R 23/20 | 324/614 |
| 2015/0369849 A1* | 12/2015 | Betts | G01R 27/06 | 324/638 |
| 2016/0087660 A1* | 3/2016 | Dunsmore | H04B 1/1027 | 455/249.1 |
| 2016/0320317 A1* | 11/2016 | Wang | G01N 22/00 | |
| 2017/0016953 A1* | 1/2017 | Beer | G01R 31/2837 | |
| 2017/0038311 A1* | 2/2017 | Conrad | G01N 22/00 | |
| 2017/0045603 A1* | 2/2017 | Krauska | G01R 27/28 | |
| 2017/0284189 A1* | 10/2017 | Thornberry | E21B 47/13 | |
| 2017/0315206 A1* | 11/2017 | Leibfritz | G01R 27/28 | |
| 2019/0064262 A1* | 2/2019 | Schnattinger | G01R 31/3025 | |

* cited by examiner

SYSTEM FOR VECTOR NETWORK ANALYSIS OF A DEVICE UNDER TEST AS WELL AS METHOD FOR VECTOR NETWORK ANALYSIS OF A DEVICE UNDER TEST

FIELD OF THE DISCLOSURE

Embodiments of the present disclosure relate generally to a system for vector network analysis of a device under test as well as a method for vector network analysis of a device under test with regard to its vector network characteristics.

BACKGROUND

Vector network analysis of a device under test, namely determining the scattering parameters (S parameters), is typically done by using a vector network analyzer (VNA) that is a single device having a stimulus generator, also called signal generator, as well as at least one measurement port for receiving a response signal of the device under test in order to determine the scattering parameters of the device under test.

The scattering parameters are determined by feeding the device under test with a stimulus signal wherein the respective response signal of the device under test is measured at the measurement port of the device under test. The relationship of the incident electromagnetic waves, also called incoming waves, and the reflected electromagnetic waves, also called outgoing waves, are investigated for determining the scattering parameters. Thus, the reflection factor as well as the transmission factor, also called reflectance or rather transmittance, of the device under test can be determined appropriately wherein these factors describe the transmission and reflection properties of the device under test. In fact, the reflection factor corresponds to the ratio of reflected electromagnetic wave(s) to incident electromagnetic wave(s). Alternatively, the reflection factor may be obtained by using the standardized impedance.

The incident electromagnetic wave is typically measured by a so-called reference channel whereas the reflected electromagnetic wave is measured by a measurement channel.

The respective components used for vector network analysis, namely the stimulus generator as well as the measurement equipment, are connected with each other via cables and/or couplers being provided internally within the single device. However, the cables and/or couplers used for connecting the components distort the measurement results since attenuations or rather phase rotations may occur. Usually, the respective measurement equipment is calibrated in advance so that the distortions are compensated appropriately.

However, the scattering parameters and, thus, the vector network characteristics of a device under test are typically measured by the single device, namely the vector network analyzer, that is connected with the device under test via cables and/or adapters. The cables and/or adapters however influence the measurement results as already outlined above. Thus, distortion of the measurement results still occurs.

Hence, there is a need for a new measurement approach being less prone to distortion and being easy to use.

SUMMARY

To address this need, or others, the present disclosure provides examples of a system for vector network analysis of a device under test. The system comprises:

at least two measurement receivers;
at least one signal generator device formed separately from the at least two measurement receivers; and
at least one data processing unit connected with the measurement receivers,
the connection between the data processing unit and at least one of the measurement receivers being flexible so that the position of the measurement receiver is adjustable.

Accordingly, the components of the system used for vector network analyzing are distributed since the measurement receivers as well as the signal generator device are formed separately from each other so that they are not integrated in a common device, for instance a vector network analyzer as known in the prior art.

Moreover, the measurement receivers are also formed separately with respect to the data processing unit as a flexible connection between these components is provided.

In addition, the at least two measurement receivers are also formed separately from each other.

The system allows to determine the scattering parameters of the device under test having large size so that the network analysis can be done over large distances without using long cables for connecting the device under test with a respective measurement port of the network analyzer. Therefore, the respective position of the measurement receiver can be adjusted so that it is located close to the device under test irrespective of the size of the device under test. Accordingly, the measurement data can be obtained in close proximity to the device under test resulting in minimized distortions.

The flexible connection means that the connection between the data processing unit and the measurement receiver can be removed, for instance for repositioning the respective measurement receiver. In other words, the flexible connection relates to a detachable connection or rather a separable connection. Thus, it becomes obvious that a flexible connection is not given in case of a network analyzer comprising the measurement receiver and the data processing unit in an integrated manner.

This concept distinguishes from the classical approach using a single device encompassing the signal generator, the data processing unit as well as the measurement equipment since the measurement receivers are separately formed with respect to the signal generator device and/or the data processing unit.

In fact, the system corresponds to a distributed vector network analysis system since the respective components are separately formed.

In general, the vector network analysis takes the amplitudes as well as the phases into account whereas the scalar network analysis only relates to the amplitudes. Hence, complex scattering parameters are investigated in the vector network analysis.

A device under test assigned to a linear network can be characterized in its entirely by the vector network analysis. Moreover, a full system error correction can only be obtained by taking the phase into account which is only possible when using the vector network analysis. Furthermore, the vector network analysis ensures that the group delay of the device under test as well as the phase velocity may be determined. Furthermore, the measurement data obtained by the vector network analysis can be transformed into the time domain.

Accordingly, the vector network analysis has certain advantages with respect to a scalar network analysis.

According to an aspect, each of the measurement receivers is at least one of a vector measurement receiver and a heterodyne receiver. The heterodyne receiver may also be called super heterodyne receiver. In fact, the heterodyne receiver uses frequency mixing to convert a received high frequency input signal (HF input signal) to a fixed intermediate frequency signal (IF signal) for further processing. For this purpose, a reference signal originating from a local oscillator is used. The local oscillator may be part of the measurement receiver.

The heterodyne receiver may be a vector measurement receiver.

Accordingly, the respective vector characteristics of the device under test can be acquired by the measurement receiver. In fact, the measurement receiver uses IQ demodulation for obtaining the respective information with regard to amplitude (amount) and phase of the signal as a vector. The amplitude (amount) and phase of the signal corresponds to a measurement value in a complex form.

In addition, each of the measurement receivers may comprise a filter for frequency band selection. The filter may be a low-pass filter so that higher frequency portions such as harmonic waves are eliminated appropriately.

According to another aspect, the measurement receivers are synchronized with each other. The at least two measurement receivers have a fixed phase relationship so that phase coherence is ensured which is required for performing vector network analysis.

For instance, the phase synchronization is ensured by using a signal of the local oscillator provided by one of the measurement receivers.

Furthermore, the measurement receivers may be synchronized with each other with regard to the sampling frequency, also called clock signal or sample clock, for analog to digital converters used by the respective measurement receivers.

Another aspect provides that the signal generator device has a reference output via which a reference signal with a reference frequency is outputted. For instance, the measurement receivers are synchronized by the reference signal. The respective reference signal is forwarded to at least one of the measurement receivers which uses the reference signal, namely the reference frequency of the respective signal, to generate control signals for controlling the other measurement receiver appropriately.

Furthermore, the reference signal, namely its reference frequency, can be used by the receiving measurement receiver for controlling its local oscillator as well as the sampling rate, namely the sample clock.

Thus, a common reference frequency, namely the one of the reference signal, is used for the system, for example the measurement receivers.

In general, the usage of the reference signal having a reference frequency ensures that all signals used by the system have a fixed phase relationship. Phase noise can be reduced appropriately.

Moreover, one of the measurement receivers in some embodiments is a master measurement receiver configured to trigger the other measurement receiver to initiate a measurement. The master measurement receiver is the one which receives the reference signal from the signal generator device. Hence, the master measurement receiver generates the appropriate signals, for instance the control signals, to control or rather trigger the other components of the system, namely the at least one further measurement receiver.

Furthermore, the data processing unit may be configured to acquire synchronized measurement results from the measurement receivers. As mentioned above, the measurement receivers are synchronized with each other wherein the respective measurements are triggered so that it can be ensured that the data processing unit being connected with both measurement receivers receives synchronized measurement results. In addition, the sampling frequency, also called clock signal or sample clock, is also synchronized for the measurement receivers ensuring the acquisition of the synchronized measurement results.

According to an embodiment, the data processing unit and the signal generator device are housed in a common housing. Thus, the data processing unit and the signal generator device correspond to a common device that is separately formed with respect to the measurement receivers. Accordingly, the system may comprise at least three separately formed components, namely the at least two separately formed measurement receivers as well as the signal generator device that additionally encompasses the data processing unit.

The measurement receivers may be positioned in a distributed manner so that the respective measurements are done at distributed locations by the measurement receivers. In contrast to a conventional network analyzer encompassing the measurement equipment within a common housing, the system according to the present disclosure comprises measurement equipment in a distributed manner. Thus, the measurement equipment, namely the measurement receivers, can be located close to the device under test avoiding long cables which might impair the measurement quality.

Furthermore, the system may comprise at least one directive component. The directive component is used for providing the signals required for determining the network characteristics of the device under test since the incident electromagnetic waves as well as the reflected electromagnetic waves can be provided at different ports of the directional coupler in an appropriate manner.

Generally, the directive component may be a directional coupler, a double directional coupler, a measurement bridge or any other suitable directive component for providing the incident electromagnetic waves as well as the reflected electromagnetic waves. A double directional coupler has an improved directivity.

In fact, each directive component separates the incident electromagnetic waves as well as the reflected electromagnetic waves at a certain port of the device under test connected with the directive component. The respective directive component used may depend on the frequency range intended for testing the device under test. A measurement bridge may be used for frequencies between several kHz and low GHz whereas a directional coupler or rather a double directional coupler are used for frequencies being in the range of high GHz.

The directive component, for instance the directional coupler, may have an interface for the device under test. Thus, the directive component may be connected with the device under test directly or via a signal line.

Moreover, the directive component, for instance the directional coupler, may be connected to the signal generator device. Thus, the signal generated by the signal generator device is forwarded to the directive component so that the incident electromagnetic wave(s) can be provided by the directive component appropriately. The directive component may be directly connected to the signal generator device or via a signal line.

In addition, the directive component, for instance the directional coupler, may be directly connected to at least one of the measurement receivers. In contrast to the measurement receivers used by the system according to the present disclosure, a network analyzer cannot be coupled to the directional coupler directly. However, direct coupling ensured by the system according to the present disclosure reduces failures due to cables provided between the directional coupler and the respective measurement equipment.

Generally, the direct connection corresponds to a wireless connection. In fact, the respective measurement receiver or any other component of the system is directly coupled without any cable connection with the respective component, for instance the directive component.

In addition, the measurement receivers may each be configured to output at least a digital measurement data signal. The digital measurement data signal may be used by the data processing unit for calculating the scattering parameters. The digital measurement data signal may relate to the IQ data obtained.

Additionally, the measurement receivers may each be configured to output an analog measurement signal. The analog measurement signal is outputted in addition to the digital measurement data signal for further analysis, for instance.

Generally, the system is a modular system that is extendable. The system may be extended by further measurement receivers being formed separately wherein the measurement receivers may be interconnected so that they can be synchronized with each other. In fact, the additional measurement receivers may relate to slave measurement receivers. Hence, devices under test having more than one port can be analyzed with regard to their vector network characteristics easily since the number of measurement receivers is adapted to the number of ports.

For instance, three or four measurement receivers may be provided for analyzing a device under test having two ports.

Further, the present disclosure provides a system for vector network analysis of a device under test, comprising a measurement receiver with a local oscillator, the measurement receiver being a homodyne receiver. The system further comprises at least one data processing unit connected with the measurement receiver, the connection between the data processing unit and the measurement receiver being flexible so that the position of the measurement receiver is adjustable. This system is a simplified one which ensures to measure the reflection factor of the device under test in a cost-efficient manner. The homodyne receiver is also called direct-conversion receiver as the signal provided by the local oscillator is used as the test signal. In fact, the test signal as well as the local oscillator signal have the same frequency so that the intermediate frequency (IF) provided by the homodyne receiver equals 0 Hz. Accordingly, the homodyne receiver is also called Zero-IF receiver. Hence, the homodyne receiver distinguishes from a heterodyne receiver appropriately.

A filter, for instance a low-pass filter, as well as an attenuator may be assigned to the measurement receiver, for example in an integrated manner, so that high frequency portions such as harmonics can be filtered. Hence, the measurement range is established by the filter. The signal of the local oscillator is attenuated by the attenuator so that it corresponds to the linear measurement range of the measurement receiver. Thus, the measurement quality can be improved.

In fact, the signal of the local oscillator is filtered by the filter wherein the filtered signal is attenuated afterwards. The filtered and attenuated signal is coupled into a directive component, for instance a directional coupler, that is connected with the device under test. The reflected signal is measured by the measurement receiver that is also connected to the directive component so that the incident electromagnetic wave provided by the local oscillator as well as the reflected electromagnetic wave received by the measurement receiver are known.

Hence, at least the reflection factor of the device under test can be determined easily and in a cost-efficient manner.

Moreover, embodiments of the present disclosure provide a method for vector network analysis a device under test with regard to its vector network characteristics, with the following steps:

providing at least two measurement receivers;

providing at least one signal generator device formed separately from the at least two measurement receivers;

providing at least one data processing unit;

providing the device under test;

connecting the measurement receivers with the device under test;

connecting the measurement receivers with the data processing unit;

generating a test signal via the signal generator device; and acquiring measurement signals via the measurement receivers.

The measurement receivers may be connected with the device under test via a directive component. Hence, the measurement receivers may be directly connected to the directive component, for instance a directional coupler, that is used for splitting the incident electromagnetic waves used for testing the device under test and the reflected electromagnetic waves. The measurement receivers can, therefore, be positioned closely to the device under test. Accordingly, measurement failures due to long cables used between the directive component and the measurement circuits, namely the measurement receivers, can be prevented appropriately.

The measurement signals acquired may relate to a reference measurement signal, namely the signal corresponding to the incident electromagnetic waves, as well as the signal corresponding to the reflected electromagnetic waves. Accordingly, one of the measurement receivers may relate to a reference measurement receiver.

This measurement receiver may also initiate the measurement so that a synchronous measurement is ensured. In fact, the respective measurement receiver may be called master measurement receiver. Thus, the other measurement receiver may be called slave measurement receiver as it is triggered by the master measurement receiver to initiate the respective measurement.

The at least two measurement receivers may be formed separately from each other.

In addition, the at least one data processing unit may be formed separately from the at least two measurement receivers.

According to an aspect, the measurement receivers are synchronized with each other. Hence, a fixed phase relationship is ensured so that the measurement quality required for performing vector network analysis is guaranteed.

Generally, the heterodyne measurement receiver as well as the homodyne measurement receiver each have a high input level dynamic, for example due to integrated programmable filters.

In addition, the heterodyne measurement receiver as well as the homodyne measurement receiver each are configured to perform complex measurements so that the complex network characteristics of the device under test can be obtained.

Prior to the measurement, a calibration of the respective system takes place such that a system error correction is performed in advance. For this calibration, it is necessary that the respective components are connected with each other in a phase locked manner.

The data processing unit receiving the measurement results is configured to evaluate the respective measurement results and to visualize the measurement results and its evaluations, respectively. To carry out such functionality, the data processing unit in some embodiments includes a processor and memory storing program instructions to be implemented by the processor. Of course, such functionality can be carried out in software, hardware, or a combination of hardware and software.

On the measurement receivers and/or the data processing unit, software may run that can be used for calibration purposes. This is inter alia useful when the system is extended by another measurement receiver.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
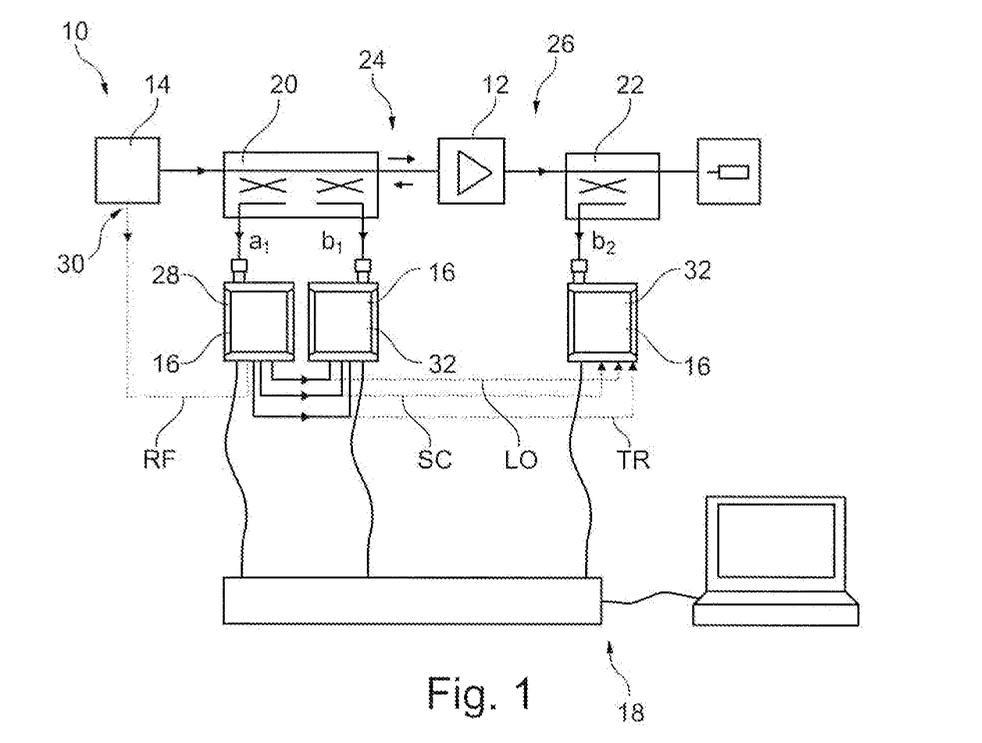
FIG. 1 shows a schematic overview of a system according to the present disclosure.

In FIG. 1, a system 10 for network analysis of a device under test 12 is shown that is used for testing the device under test 12 with regard to its vector network characteristics. As shown in FIG. 1, the system 10 comprises a signal generator device 14 as well as a number of (shown as three) separately formed measurement receivers 16. The measurement receivers 16 are vector measurement receivers. The system 10 also includes a data processing unit 18 that is connected with the measurement receivers 16 in a flexible manner so that a flexible connection is established that can be separated for re-positioning the measurement receivers 16, for instance.

Further, the system 10 comprises a first directive component 20 established by a double directional coupler (having a good directivity) as well as a second directive component 22 established by a directional coupler. Both directive components 20, 22 are connected with the device under test 12 wherein they are assigned to different ports 24, 26 of the device under test 12 having two ports 24, 26 in total. Accordingly, both directive components 20, 22 have an interface for the device under test 12.

The signal generator device 14 generates a signal, also called test signal, that is forwarded to the device under test 12 via the first directive component 20. Hence, the first directive component 20 is connected to the signal generator device 14.

The signal generated by the signal generator device 14 is forwarded to the first directive component 20, the incident signal $a_1$ as well as the reflected signal $b_1$ are obtained at different ports of the first directive component 20 wherein the ports are assigned to different measurement receivers 16.

With regard to the second port 26 of the device under test 12, the second directive component 22 provides another signal $b_2$ related to the signal generated by the signal generator device 14, also called test signal. The signal $b_2$ corresponds to a signal used for characterizing the vector network characteristics of the device under test 12 having two ports 24, 26 with regard to its transmission properties (transmission factor).

Accordingly, the respective signals required for characterizing the device under test 12 with regard to its vector network properties can be generally obtained by the respective measurement receivers 16.

As shown in FIG. 1, the signal generator device 14 is also connected with one of the measurement receivers 16 being, for example, a master measurement receiver 28. In this embodiment, the master measurement receiver 28 receives a reference signal RF outputted via a reference output 30 of the signal generator device 14. The reference signal RF has a reference frequency that is used by the master measurement receiver 28 for generating a local oscillator signal LO which is inter alia forwarded to the other measurement receivers 16 being slave measurement receivers 32.

In addition, the reference signal RF with the reference frequency is used by the master measurement receiver 28 to generate a sampling rate or sample clock signal SC that is used by analog to digital converters of the respective measurement receivers 16.

In general, the master measurement receiver 28 ensures that the separately formed measurement receivers 16 are synchronized with each other since the reference signal RF with the reference frequency is used for all signals generated by the master measurement receiver 28 and used by the components of the system 10, for example the measurement receivers 16. Accordingly, the respective vector network measurements can be performed by the system 10 even though the measurement receivers 16 are separately formed and located in a distributed manner. In other words, the respective measurements are done at distributed locations by the measurement receivers 16. Put it another way, the measurement data is obtained at distributed locations by the measurement receivers 16.

Figure 5:
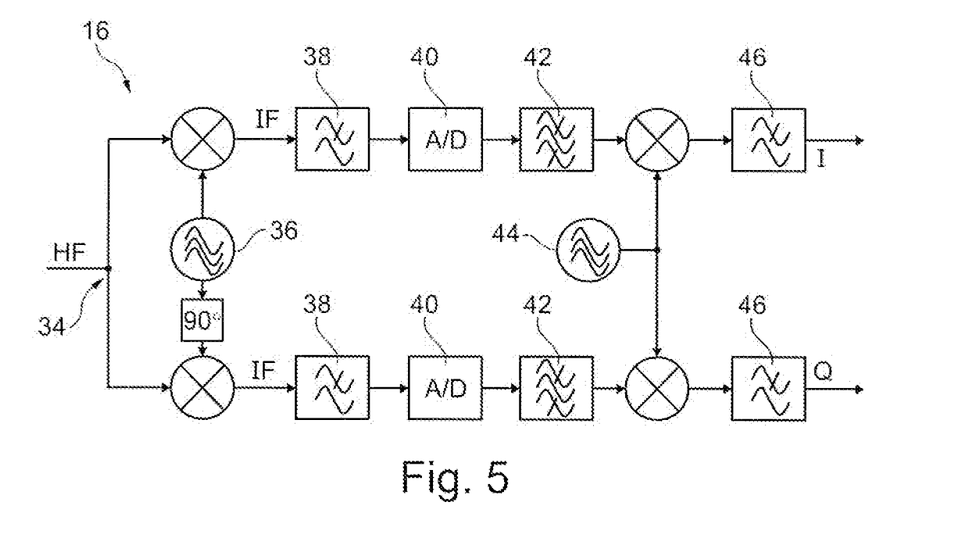
FIG. 5 shows a schematic overview of a measurement receiver used by a system according to the present disclosure.

In FIG. 5, one of the measurement receivers 16 is shown in more detail.

The measurement receiver 16 comprises an input 34 receiving an input signal, for instance a high frequency signal (HF signal). The signal corresponds to the incident electromagnetic waves or the reflected electromagnetic waves depending on the usage of the measurement receiver 16. For instance, the master measurement receiver 28 receives an incident signal $a_1$ whereas the first slave measurement receiver 32 receives a reflected signal $b_1$.

The input signal HF is split into two signal portions processed by different internal parts of the measurement receiver 16 wherein the signal portions are mixed by using a local oscillator 36 into an intermediate frequency (IF). The mixing signal applied for mixing is phase-shifted by 90° for one path previously so that the respective phase information of the input signal HF is maintained during the signal processing. This is generally known as IQ-demodulation.

The local oscillator 36 of the master measurement receiver 28 uses the reference signal RF for generating the mixing signal used for mixing the input signal HF, for example its signal portions split previously.

The other measurement receivers 16, namely the slave measurement receivers 32, use the local oscillator signal LO of the master measurement receiver 28 for generating the respective mixing signal. Put it another way, the signal generated by the local oscillator 36 of the master measurement receiver 28 by using the reference signal RF received is used by the local oscillators 36 of the slave measurement receivers 32 for generating their respective mixing signal.

Thus, all mixing signal used in the system 10 are derived from the reference signal RF (directly or indirectly).

The signal portions mixed into the intermediate frequency IF are filtered by filters 38 and processed by analog-to-digital converters 40 appropriately wherein the converted signal portions are filtered again by filters 42.

Accordingly, a frequency band selection takes place.

The respective analog-to-digital converters 40 are controlled by the sampling rate, namely the sample clock signal SC, generated by the master measurement receiver 28 and forwarded to the other measurement receivers 16 as shown in FIG. 1.

Afterwards, a numerically controlled oscillator 44 is used for providing a signal used to mix the signal portions to a frequency of 0 Hz so that IQ values (pair of values) are obtained. The signal generated by the numerically controlled oscillator 44 may also be derived from the reference signal RF.

Accordingly, a fixed relative phase (coherence) of the signal generated by the signal generator device 14, the local oscillator signal LO as well as the signal generated by the numerically controlled oscillator 44 can be ensured.

As shown in FIG. 5, additional filters 46 are used for low-pass filtering the respective signal portions at the end. Thus, high frequency signal portions such as harmonics can be eliminated. Again, a frequency band selection takes place.

The respective pairs of values (IQ data) can be used to determine the amplitude and phase of the input signal. This digital data can be outputted appropriately as a digital measurement signal. In some embodiments, the digital data is forwarded to the data processing unit 18 for further processing.

In addition, the measurement receivers 16 may also output the analog measurement signal additionally.

In fact, all signals used by the components of the system 10 are derived from the reference signal RF. For instance, phase locked loops (PLLs) are used for this purpose. The phase locked loops may be realized by phase detectors combined with voltage-controlled oscillators (analog) and/or flip-flops (digital).

As already mentioned above, the reference signal RF with the reference frequency is received by the first measurement receiver 16, namely the master measurement receiver 28, that uses the reference signal RF for generating its signals, namely its local oscillator signal LO as well as the sampling rate, also called clock signal SC, for the analog to digital converters 40.

Further, the respective signals such as the signal of the local oscillator LO and the clock signal SC are forwarded to the other measurement receivers 16, namely the slave measurement receivers 32. Accordingly, all other measurement receivers 16, namely the slave measurement receivers 32, use a phased-locked local oscillator signal LO so that an arbitrary poly phase can be used for generating the local oscillator signal LO of the master measurement receiver 28.

In other words, the master measurement receiver 28 uses the reference signal RF as a basis for generating the respective signals forwarded to the slave measurement receivers 32. However, the signals generated are based on the reference signal RF, for example its reference frequency.

In addition to the signals mentioned above that are forwarded to the slave measurement receivers 32, the master measurement receiver 28 is also configured to trigger the other measurement receivers 16, namely the slave measurement receivers 32, to initiate a respective measurement. For this purpose, a trigger signal TR is forwarded to the slave measurement receivers 32. Hence, the measurement is initiated by the master measurement receiver 28 so that synchronized measurements with regard to the measurement time are ensured.

It is further ensured that the data processing unit 18 acquires synchronized measurement results from the separately formed measurement receivers 16, namely the respective IQ data.

The measurement data obtained or rather acquired can be processed appropriately by the data processing unit 18 for determining the scattering parameters of the device under test 12 in order to verify the scattering parameters of the device under test 12.

Since the master measurement receiver 28 is used to measure the incident signal, the master measurement receiver 28 is assigned to the reference channel. In contrast thereto, the slave measurement receiver(s) 32 measure(s) the reflected signal(s) so that the slave measurement receiver(s) 32 is/are assigned to the measurement channel(s).

For establishing the communication between the measurement receivers 16, software may run on the respective measurement receivers 16.

Figure 2:
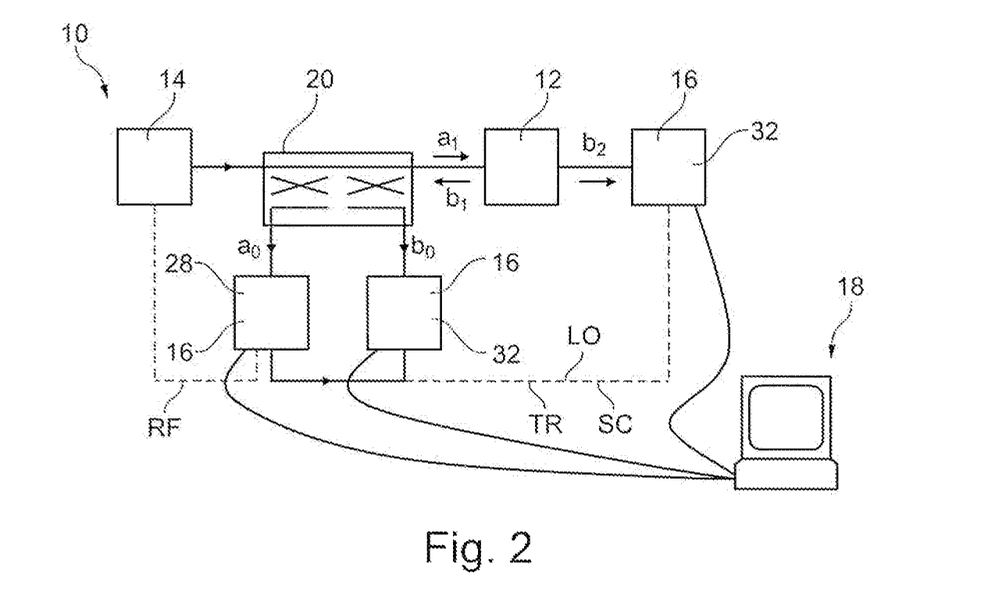
FIG. 2 shows another schematic overview of a system according to present disclosure.

In FIG. 2, another system 10 is shown that distinguishes from the system 10 shown in FIG. 1 by the fact that the second slave measurement receiver 32 is directly connected to the device under test 12, for example its second port 26 so that the second directive component 22 previously used is not provided anymore. Hence, the second slave measurement receiver 32 is connected to the device under test 12 in a wireless manner as no cable is interposed.

The systems 10 shown in FIG. 1 and FIG. 2 are used for characterizing a device under test 12 having two ports 24, 26.

As shown in FIG. 2, the master measurement receives 28 and the first slave measurement receiver 32 measure signals $a_0$ and $b_0$ respectively that deviate from the incident signal $a_1$ and the reflected signal $b_1$. This deviation arises due to the measurement setup. However, the incident signal $a_1$ and the reflected signal $b_1$ may be obtained from the measured signals by applying a failure correction in an appropriate manner.

Figure 3:
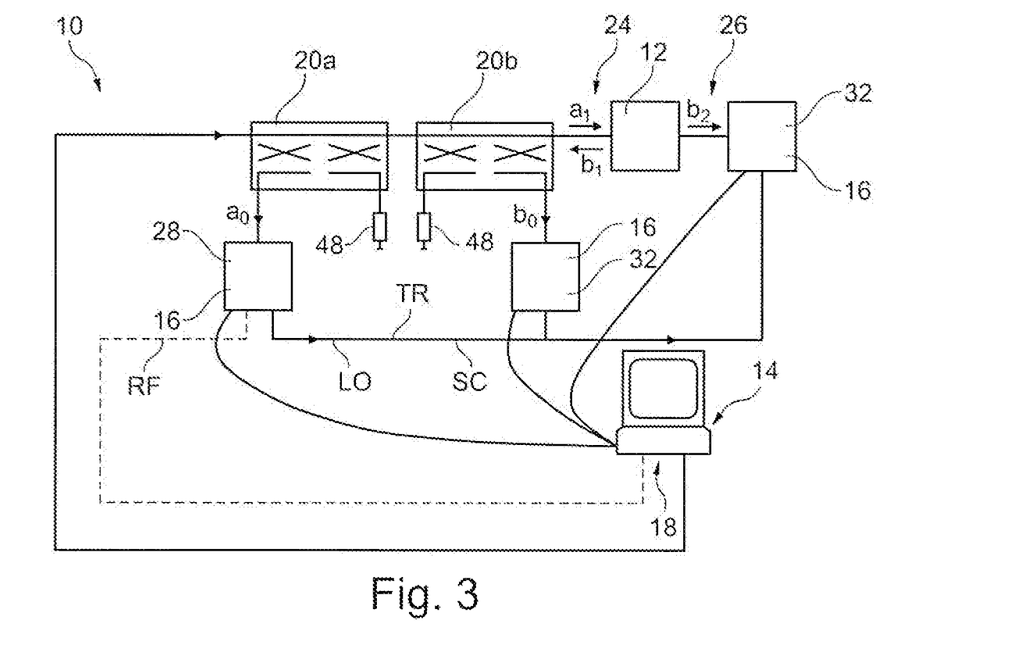
FIG. 3 shows another schematic overview of a system according to the present disclosure.

In FIG. 3, another system 10 is shown that distinguishes from the system 10 shown in FIG. 2 by the fact that the master measurement receiver 28 as well as a first slave measurement receiver 32 are assigned to an own directive component 20*a*, 20*b* both being assigned to the first port 24 of the device under test 12.

Both directive components 20a, 20b are established by double directional couplers wherein free ports are each terminated by a match 48.

Moreover, the data processing unit 18 and the signal generator device 14 are housed in a common housing. Hence, the number of different components is reduced.

However, the measurement receivers 16 are still formed separately with regard to the data processing unit 18 and the signal generator device 14 so that the measurement receivers 16 can be located at any desired location due to the flexible connection.

Figure 4:
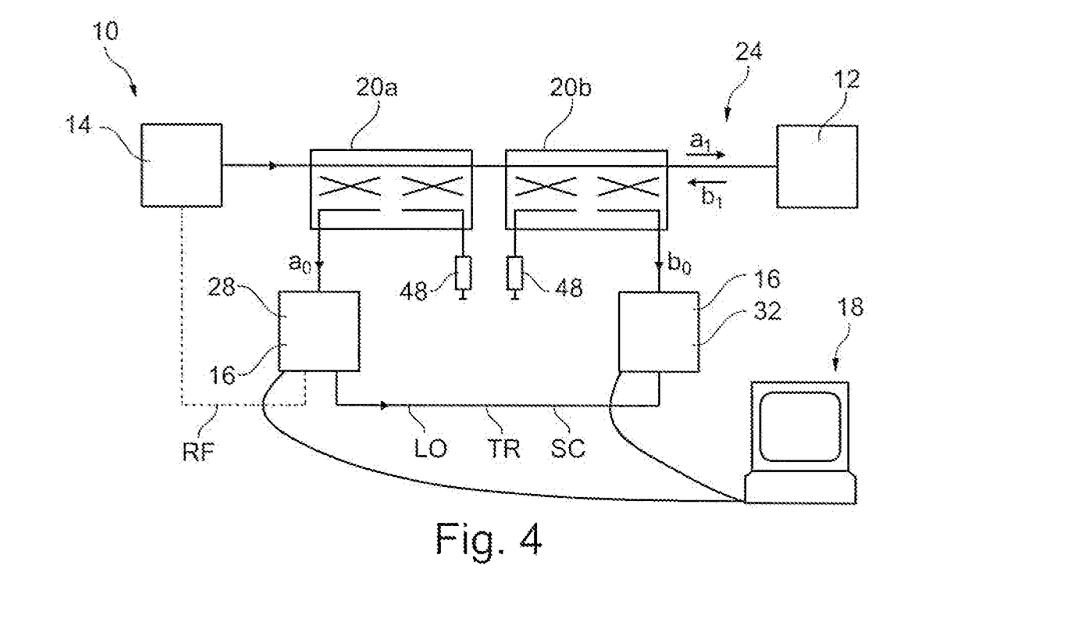
FIG. 4 shows another schematic overview of a system according to the present disclosure.

In FIG. 4, a system 10 is shown that is used for analyzing the network characteristics of a single port device under test 12. In this system 10, only two measurement receivers 16 are used wherein a master measurement receiver 28 as well as one slave measurement receiver 32 are provided. The measurement principle corresponds to the one described earlier.

It becomes obvious that the system 10 is generally extendable by using more measurement receivers 16, for example slave measurement receivers 32. The number of measurement receivers 16 inter alia depends on the number of ports of the device under test 12. Accordingly, the system 10 is a modular system that is extendable by incorporating more measurement receivers 16.

Figure 6:
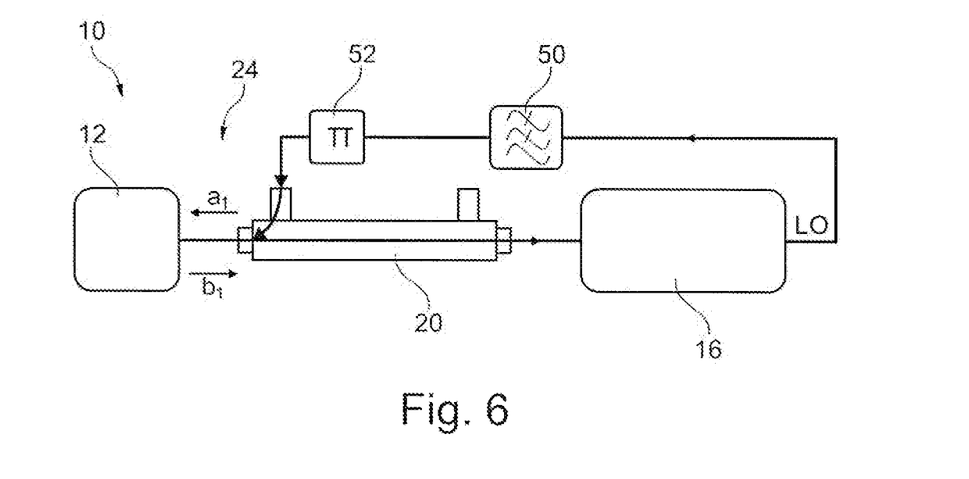
FIG. 6 shows another schematic overview of a part of a system according to the present disclosure.

In FIG. 6, another system 10 is shown being a very simple one since a single measurement receiver 16 is used for characterizing the device under test 12, for example determining the reflectance. The measurement receiver 16 used in this system 10 corresponds to a homodyne receiver that also has a local oscillator as described with regard to FIG. 5.

The measurement receiver 16 uses the signal provided by its local oscillator is used as the test signal for the device under test 12. In fact, the test signal as well as the local oscillator signal LO have the same frequency so that the intermediate frequency (IF) provided by the homodyne receiver equals 0 Hz.

A filter 50, for instance a low-pass filter, as well as an attenuator 52 may be assigned to the measurement receiver 16 so that high frequency portions such as harmonics can be filtered. In fact, the local oscillator signal LO is filtered by the filter 50 wherein the filtered signal is attenuated by the attenuator 52 afterwards.

The filtered and attenuated signal is coupled into the directive component 20, for instance a directional coupler, that is connected with the device under test 12. The reflected signal $b_1$ is measured by the measurement receiver 16 that is also connected to the directive component 20.

Since the attenuation and filter settings are known, the incident signal $a_1$ as well as the reflected signal $b_1$ received by the measurement receiver 16 can be determined appropriately.

The system 10 further comprises the data processing unit 14 (not shown) which is connected with the single measurement receiver 16. The connection between the data processing unit 14 and the measurement receiver 16 is flexible so that the position of the measurement receiver 16 is adjustable.

By the system 10, at least the reflection factor of the device under test 12 can be determined easily and in a cost-efficient manner.

Generally, the measurement receivers 16 are separately formed with respect to the other components of the system 10 so that they are connected with the data processing unit 18 by a flexible connection that can be separated easily. This ensures a re-positioning of the measurement receivers 16.

Accordingly, the measurement receivers 16 can be assigned to different sized devices under test 12 easily without increasing distortions that might occur due to longer cables. In fact, the measurement receivers 16 can be coupled directly to the device under test 12 minimizing any occurring distortions.

Components of the system described herein, including the data processing unit 18, may include, in some embodiments, logic for implementing the technologies and methodologies described herein. This logic can be carried out in either hardware or software, or a combination of hardware and software. In some embodiments, these components include one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the data processing unit 18 includes a microprocessor and a memory storing logic modules and/or instructions. In an embodiment, the data processing unit 18 includes one or more ASICs having a plurality of predefined logic components. In an embodiment, the data processing unit 18 includes one or more FPGA having a plurality of programmable logic components. In an embodiment, the data processing unit 18 includes hardware circuit implementations (e.g., implementations in analog circuitry, implementations in digital circuitry, and the like, and combinations thereof). In an embodiment, the data processing unit 18 includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A system for vector network analysis of a device under test, comprising:
   at least two measurement receivers;
   at least one signal generator device formed separately from the at least two measurement receivers; and
   at least one data processing unit connected with the measurement receivers, the connection between the at least one data processing unit and at least one of the measurement receivers being flexible so that the position of the measurement receiver is adjustable,
   wherein the at least one measurement receiver is formed separately with respect to the data processing unit such that a flexible connection between the data processing unit and the respective measurement receiver is provided,
   wherein the flexible connection enables a repositioning of the respective measurement receiver with respect to the data processing unit,
   wherein the signal generator device has a reference output via which a reference signal is outputted that is forwarded to at least one of the measurement receivers, the at least one of the measurement receivers configured to use the reference signal to generate control signals for controlling the other measurement receiver such that the measurement receivers are synchronized by the reference signal.

2. The system according to claim 1, wherein each of the measurement receivers is at least one of a vector measurement receiver and a heterodyne receiver.

3. The system according to claim 1, wherein each of the measurement receivers comprises a filter for frequency band selection.

4. The system according to claim 1, wherein the measurement receivers are synchronized with each other.

5. The system according to claim 1, wherein one of the measurement receivers is a master measurement receiver configured to trigger the other measurement receiver to initiate a measurement.

6. The system according to claim 1, wherein the data processing unit is configured to acquire synchronized measurement results from the measurement receivers.

7. The system according to claim 1, wherein the data processing unit and the signal generator device are housed in a common housing.

8. The system according to claim 1, wherein the measurement receivers are positioned in a distributed manner so that respective measurements are done at distributed locations by the measurement receivers.

9. The system according to claim 1, wherein the system comprises at least one directive component.

10. The system according to claim 9, wherein the directive component has an interface for the device under test.

11. The system according to claim 9, wherein the directive component is connected to the signal generator device.

12. The system according to claim 9, wherein the directive component is directly connected to at least one of the measurement receivers.

13. The system according to claim 1, wherein the measurement receivers are each configured to output at least a digital measurement data signal.

14. The system according to claim 1, wherein the measurement receivers are each configured to output an analog measurement signal.

15. The system according to claim 1, wherein the system is a modular system that is extendable.

16. The system according to claim 1, wherein the system corresponds to a distributed vector network analysis system since the at least one measurement receiver and the data processing unit are separately formed with respect to each other so that they are not integrated in a common device.

17. A system for vector network analysis of a device under test, comprising:
a measurement receiver comprising a local oscillator, the measurement receiver being a homodyne receiver; and
at least one data processing unit connected with the measurement receiver,
the connection between the data processing unit and the measurement receiver being flexible so that the position of the measurement receiver is adjustable,
wherein the system corresponds to a distributed vector network analysis system in which the measurement receiver and the data processing unit are separately formed with respect to each other so that they are not integrated in a common device, and
wherein the measurement receiver uses a local oscillator signal provided by the local oscillator as a test signal for the device under test, thereby ensuring that the test signal as well as the local oscillator signal have the same frequency so that an intermediate frequency provided by the homodyne receiver equals 0 Hz.

18. A method for testing a device under test with regard to its vector network characteristics, with the following steps:
providing at least two measurement receivers,
providing at least one signal generator device formed separately from the at least two measurement receivers,
providing at least one data processing unit, wherein the at least one data processing unit is separately formed with respect to at least one of the measurement receivers;
providing the device under test;
connecting the measurement receivers with the device under test;
connecting the measurement receivers with the data processing unit, wherein at least one of the measurement receivers is connected with the data processing unit in a flexible manner, thereby establishing a flexible connection between the data processing unit and the respective measurement receiver, wherein the flexible connection enables a repositioning of the respective measurement receiver with respect to the data processing unit;
generating a test signal via the signal generator device; and
acquiring measurement signals via the measurement receivers,
wherein the signal generator device has a reference output via which a reference signal is outputted that is forwarded to at least one of the measurement receivers, the at least one of the measurement receivers configured to use the reference signal to generate control signals for controlling the other measurement receiver such that the measurement receivers are synchronized by the reference signal.

19. The method according to claim 18, wherein the measurement receivers are synchronized with each other.

* * * * *